(12) United States Patent
Yin et al.

(10) Patent No.: US 10,810,395 B2
(45) Date of Patent: Oct. 20, 2020

(54) ELECTRONIC DEVICE AND IMAGE CAPTURE METHOD

(71) Applicant: Guangzhou Tyrafos Semiconductor Technologies Co., LTD, Guangzhou (CN)

(72) Inventors: Ping-Hung Yin, Taipei (TW); Jia-Shyang Wang, Miaoli County (TW)

(73) Assignee: Guangzhou Tyrafos Semiconductor Technologies Co., LTD, Guangzhou (CN)

( * ) Notice: Subject to any disclaimer, the term of this patent is extended or adjusted under 35 U.S.C. 154(b) by 0 days.

(21) Appl. No.: 16/352,833

(22) Filed: Mar. 14, 2019

(65) Prior Publication Data

US 2020/0111825 A1 Apr. 9, 2020

(30) Foreign Application Priority Data

Oct. 5, 2018 (TW) .............................. 107135211 A

(51) Int. Cl.
*G06K 9/00* (2006.01)
*H04N 5/235* (2006.01)
(Continued)

(52) U.S. Cl.
CPC ......... *G06K 9/00013* (2013.01); *G02B 1/041* (2013.01); *G02B 3/0006* (2013.01);
(Continued)

(58) Field of Classification Search
CPC .. H04N 5/2355; H04N 5/355; H04N 5/35518; H04N 5/35527; H04N 5/35536;
(Continued)

(56) References Cited

U.S. PATENT DOCUMENTS

2003/0128405 A1* 7/2003 Tay .................... H04N 1/32358
358/474
2004/0239779 A1* 12/2004 Washisu ................ H04N 5/235
348/239

(Continued)

FOREIGN PATENT DOCUMENTS

TW I507031 11/2015
TW I563851 12/2016

OTHER PUBLICATIONS

"Office Action of Taiwan Counterpart Application", dated Jun. 18, 2019, p. 1-p. 7.

*Primary Examiner* — Albert H Cutler
(74) *Attorney, Agent, or Firm* — JCIPRNET

(57) ABSTRACT

An electronic device and an image capture method are provided. The electronic device includes an image sensor, a ramp analog to digital converter, and a memory. The image sensor includes a plurality of pixel units arranged in an array, and the pixel units output a plurality of first image capturing signals and a plurality of second image capturing signals in an image capturing operation. The ramp analog to digital converter generates a plurality of most significant bit data corresponding to a plurality of pixels according to a first nonlinear ramp signal and the first image capturing signals, and generates a plurality of least significant bit data corresponding to the plurality of pixels according to a second nonlinear ramp signal and the second image capturing signals. The memory stores the most significant bit data of these pixels and the least significant bit data of these pixels together to generate frame data.

16 Claims, 3 Drawing Sheets

(51) Int. Cl.

| | | |
|---|---|---|
| H04N 5/355 | (2011.01) | |
| H04N 5/378 | (2011.01) | |
| H01L 27/146 | (2006.01) | |
| H04N 5/3745 | (2011.01) | |
| H04N 5/353 | (2011.01) | |
| G11C 11/412 | (2006.01) | |
| G11C 11/419 | (2006.01) | |
| H01L 27/11 | (2006.01) | |
| H04N 1/21 | (2006.01) | |
| G09G 3/3225 | (2016.01) | |
| G06F 13/20 | (2006.01) | |
| H04N 5/232 | (2006.01) | |
| G06F 13/42 | (2006.01) | |
| H04N 1/00 | (2006.01) | |
| G02B 1/04 | (2006.01) | |
| G02B 3/00 | (2006.01) | |
| G02B 27/09 | (2006.01) | |
| G02B 27/42 | (2006.01) | |
| G03F 7/20 | (2006.01) | |
| H01L 23/00 | (2006.01) | |
| G02B 27/30 | (2006.01) | |
| H04L 29/08 | (2006.01) | |
| G11C 7/10 | (2006.01) | |
| G11C 7/24 | (2006.01) | |
| G06F 13/38 | (2006.01) | |
| G06K 9/20 | (2006.01) | |
| G02B 6/32 | (2006.01) | |
| H01S 5/022 | (2006.01) | |
| H01S 5/183 | (2006.01) | |
| F21K 9/60 | (2016.01) | |

(52) U.S. Cl.
CPC ......... *G02B 27/0944* (2013.01); *G02B 27/30* (2013.01); *G02B 27/4233* (2013.01); *G03F 7/20* (2013.01); *G06F 13/20* (2013.01); *G06F 13/4282* (2013.01); *G06K 9/0004* (2013.01); *G09G 3/3225* (2013.01); *G11C 11/412* (2013.01); *G11C 11/419* (2013.01); *H01L 24/48* (2013.01); *H01L 27/1104* (2013.01); *H01L 27/14601* (2013.01); *H01L 27/14605* (2013.01); *H01L 27/14609* (2013.01); *H01L 27/14643* (2013.01); *H01L 27/14685* (2013.01); *H04N 1/00214* (2013.01); *H04N 1/2137* (2013.01); *H04N 5/2351* (2013.01); *H04N 5/2352* (2013.01); *H04N 5/2353* (2013.01); *H04N 5/2356* (2013.01); *H04N 5/232061* (2018.08); *H04N 5/3535* (2013.01); *H04N 5/35509* (2013.01); *H04N 5/35536* (2013.01); *H04N 5/35554* (2013.01); *H04N 5/35581* (2013.01); *H04N 5/378* (2013.01); *H04N 5/37452* (2013.01); *H04N 5/37455* (2013.01); *G06F 2213/0002* (2013.01); *G09G 2320/064* (2013.01); *G09G 2354/00* (2013.01); *H01L 2224/48091* (2013.01); *H04L 67/10* (2013.01); *H04N 2201/0084* (2013.01)

(58) Field of Classification Search
CPC .......... H04N 5/35545; H04N 5/35554; H04N 5/35572; H04N 5/378; H04N 5/35581; H04N 5/35509; H04N 5/2353; H04N 5/37455; H04N 5/37452; H04N 5/2352; H04N 5/2356; H04N 5/2351; H04N 5/3535; H04N 1/2137; H04N 2201/0084; H04N 5/232061; H04N 1/00214; H04N 5/232; H01L 27/14605; H01L 27/14643; H01L 27/14609; H01L 27/1104; H01L 24/48; H01L 27/14601; H01L 27/14685; H01L 2224/48091; G06K 9/00013; G06K 9/0004; G06K 9/209; G11C 11/412; G11C 11/419; G11C 7/1096; G11C 7/24; G03F 7/20; G03F 7/70475; G03F 7/70491; G03F 7/70508; G02B 27/30; G02B 1/041; G02B 3/0006; G02B 27/0944; G02B 27/4233; G02B 3/0068; G02B 6/32; G09G 2320/064; G09G 2354/00; G09G 3/3225; H04L 67/10; G06F 2213/0002; G06F 13/20; G06F 13/4282; G06F 13/385; G06F 13/4291; Y02D 10/00; H01S 5/0228; H01S 5/183; F21K 9/60
See application file for complete search history.

(56) References Cited

U.S. PATENT DOCUMENTS

| | | | |
|---|---|---|---|
| 2008/0218619 A1* | 9/2008 | Egawa | H04N 5/243 348/296 |
| 2009/0219387 A1* | 9/2009 | Marman | G08B 13/19652 348/143 |
| 2012/0113286 A1* | 5/2012 | Lim | H03M 1/144 348/222.1 |
| 2012/0249844 A1 | 10/2012 | Saito et al. | |
| 2015/0062393 A1* | 3/2015 | Komaba | H04N 5/37457 348/300 |
| 2015/0372688 A1* | 12/2015 | Hashimoto | H03M 1/002 348/294 |
| 2016/0021323 A1* | 1/2016 | Aibara | H04N 5/378 348/294 |
| 2016/0182781 A1* | 6/2016 | Mabuchi | H04N 5/2253 348/322 |
| 2017/0041562 A1 | 2/2017 | Solhusvik | |
| 2017/0078607 A1* | 3/2017 | Totsuka | H04N 5/37455 |
| 2017/0251151 A1 | 8/2017 | Hicks | |
| 2019/0019835 A1* | 1/2019 | Tanaka | H01L 27/146 |
| 2020/0053310 A1* | 2/2020 | Ushinaga | H04N 5/378 |

* cited by examiner

ELECTRONIC DEVICE AND IMAGE CAPTURE METHOD

CROSS-REFERENCE TO RELATED APPLICATION

This application claims the priority benefit of Taiwan application serial no. 107135211, filed on Oct. 5, 2018. The entirety of the above-mentioned patent application is hereby incorporated by reference herein and made a part of this specification.

BACKGROUND OF THE INVENTION

Field of the Invention

The disclosure relates to an image sensing technique and, more particularly, to an electronic device and an image capture method.

Description of Related Art

With the evolution of image sensing technique, more and more electronic products are equipped with image sensing functions, such as photo shooting or fingerprint sensing. However, for high-quality image capture results, such as the high dynamic range (HDR) frame, a general image sensor captures two frames with different exposure levels and overlays the bright area and the shaded area to obtain a high dynamic range frame. In this regard, the general image sensor, for example, first captures and stores the frame data in which the amount of data of each pixel is respectively 10 bits (10 bits+10 bits=20 bits) to the memory and then performs data compression (for example, compresses 20 bits to 16 bits). In other words, the conventional method of obtaining a high dynamic range frame requires more image capturing time and image processing time and also requires more memory size. In view of the above, several solutions are to be presented in the embodiments below on how to obtain a high-quality frame and effectively save the memory size.

SUMMARY OF THE INVENTION

An electronic device and an image capture method that obtain frame data of high quality and effectively save the memory size are provided.

The electronic device of the disclosure includes an image sensor, a ramp analog to digital converter and a memory. The image sensor includes a plurality of pixel units arranged in an array, and the plurality of pixel units are configured to output a plurality of first image capturing signals and a plurality of second image capturing signals in an image capturing operation. A ramp analog to digital converter is coupled to the image sensor. The ramp analog to digital converter is configured to generate a first non-linear analog ramp signal and a second non-linear ramp signal. The ramp analog to digital converter generates a plurality of most significant bit data corresponding to a plurality of pixels according to the first non-linear ramp signal and the plurality of first image capturing signals and generates a plurality of least significant bit data corresponding to the plurality of pixels according to the second non-linear ramp signal and the plurality of second image capturing signals. A processor is coupled to the ramp analog to digital converter. The memory stores the plurality of most significant bit data of the plurality of pixels and the plurality of least significant bit data of the plurality of pixels together to generate a frame data.

An image capture method of the disclosure includes the following steps. A plurality of first image capturing signals and a plurality of second image capturing signals are outputted in an image capturing operation by a plurality of pixel units arranged in an array in the image sensor. A first non-linear analog ramp signal and a second non-linear ramp signal are generated by a ramp analog to digital converter. A plurality of most significant bit data corresponding to a plurality of pixels are generated by the ramp analog to digital converter according to the first non-linear ramp signal and the plurality of first image capturing signals. A plurality of least significant bit data corresponding to the plurality of pixels are generated by the ramp analog to digital converter according to the second non-linear ramp signal and the plurality of second image capturing signals. The plurality of most significant bit data of the plurality of pixels and the plurality of least significant bit data of the plurality of pixels are stored together by the memory to generate a frame data.

Based on the above, the electronic device and the image capture method of the disclosure may generate a plurality of most significant bit data corresponding to a plurality of pixels by the ramp analog to digital converter according to the first non-linear ramp signal and the plurality of first image capturing signals and generate a plurality of least significant bit data corresponding to the plurality of pixels according to the second non-linear ramp signal and the plurality of second image capturing signals, wherein the plurality of most significant bit data and the plurality of least significant bit data of the plurality of pixels may be combined into a frame data. Therefore, the electronic device and the image capture method of the disclosure may obtain the frame data of high quality (high dynamic range) and effectively save the memory size.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
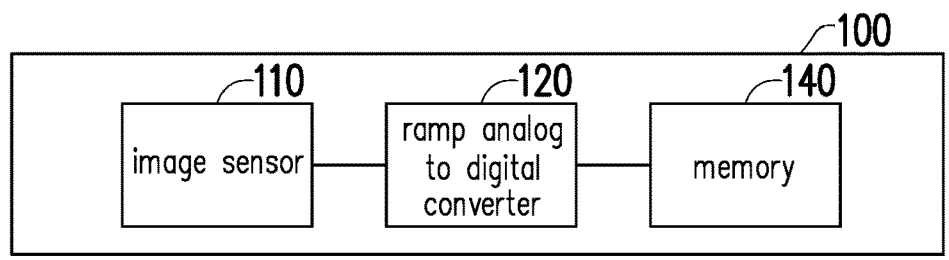
FIG. 1 is a schematic view of an electronic device according to an embodiment of the disclosure.

In order to make the disclosure more comprehensible, several embodiments are described below as examples of implementation of the disclosure. Moreover, elements/components/steps with the same reference numerals are used to represent identical or similar parts in the figures and embodiments where appropriate.

FIG. 1 is a schematic view of an electronic device according to an embodiment of the disclosure. Referring to FIG. 1, an electronic device 100 includes an image sensor 110, a ramp analog to digital converter (ramp ADC) 120 and a memory 140. The image sensor 110 is coupled to the ramp analog to digital converter 120. The ramp analog to digital converter 120 is coupled to the memory 140. In this embodiment, the image sensor 110 may include a plurality of pixel units arranged in an array, and the plurality of pixel units are configured to output a plurality of first image capturing signals and a plurality of second image capturing signals in an image capturing operation. The ramp analog to digital converter 120 may compare the plurality of first image capturing signals and the plurality of second image capturing signals according to a first non-linear ramp signal and a second non-linear clipping signal to obtain a plurality of most significant bit (MSB) data and a plurality of least significant bit (LSB) data corresponding to a plurality of pixels. The processor 130 may combine the plurality of most significant bit data and the plurality of least significant bit data of the plurality of pixels into a frame data, and the memory 140 only needs to store the frame data in the image capturing operation.

For example, in an embodiment, the ramp analog to digital converter 120 may include a comparator. For each pixel in a frame, the aforementioned image capturing signal may be input to one end of the comparator, and the non-linear ramp signal may be input to the other end of the comparator. A voltage value of the non-linear ramp signal increases with time until it equals a voltage value of the image capturing signal, then the ramp analog to digital converter 120 may read out a digital number (DN) of the pixel corresponding to a luminance of the pixel.

In this embodiment, the electronic device 100 may be an integrated circuit or a portable electronic product, such as a mobile phone, a tablet or laptop computer, but the disclosure is not limited thereto. In this embodiment, the image sensor 110 may be a complementary metal oxide semiconductor (CMOS) image sensor (CIS) or a charge coupled device (CCD). In this embodiment, the ramp analog to digital converter 120 may generate the first non-linear analog ramp signal and the second non-linear ramp signal and compare the plurality of first image capturing signals and the plurality of second image capturing signals obtained by the image sensor 110 by the first non-linear ramp signal and the second non-linear ramp signal to obtain a plurality of most significant bit data and a plurality of least significant bit data corresponding to a plurality of pixels.

In this embodiment, the memory 140 is configured to store the frame data as described in each embodiment of the disclosure.

In an embodiment, the electronic device 100 may be an integrated circuit or a portable electronic product having an under-display optical fingerprint identification function, and the image sensor 110 may be a fingerprint sensor. In this regard, the electronic device 100 may be adapted to perform fingerprint sensing, and the image sensor 110 may obtain two fingerprint image capturing signals according to different exposure time, and the ramp analog to digital converter 120 scans the two fingerprint image capturing signals according to the first non-linear ramp signal and the second non-linear ramp signal to obtain a plurality of most significant bit data and a plurality of least significant bit data corresponding to a plurality of pixels in a fingerprint frame.

As a result, in this embodiment, the electronic device 100 may achieve a fingerprint frame of high quality (high dynamic range) and save the memory size.

Figure 2A:
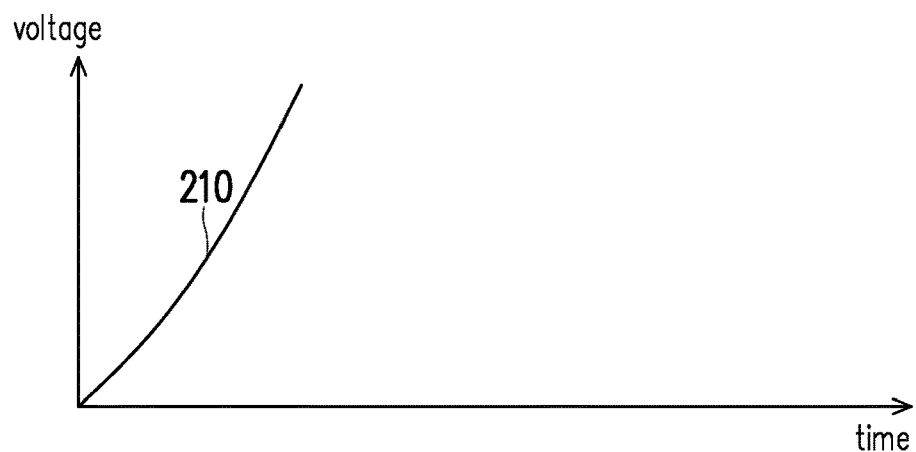
FIG. 2A is a schematic view of a first non-linear ramp signal according to an embodiment of the disclosure.
Figure 2B:
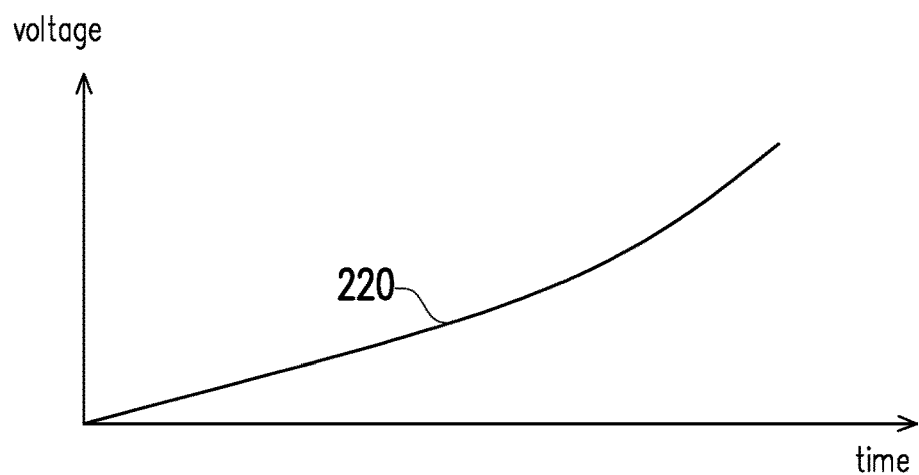
FIG. 2B is a schematic view of a second non-linear ramp signal according to an embodiment of the disclosure.

FIG. 2A is a schematic view of a first non-linear ramp signal according to an embodiment of the disclosure. FIG. 2B is a schematic view of a second non-linear ramp signal according to an embodiment of the disclosure. Referring to FIG. 1, FIG. 2A and FIG. 2B, FIG. 2A and FIG. 2B illustrate the voltage versus time relation curve of the non-linear ramp signal. In this embodiment, the voltage versus time relation curve 210 of the first non-linear ramp signal and the voltage versus time relation curve 220 of the second non-linear ramp signal are used to scan a first sampling signal and a second sampling signal provided by the pixel units. When the voltage value of the first sampling signal is the same as the voltage value of the first non-linear ramp signal at a certain point on the voltage versus time relation curve 210, then the ramp analog to digital converter 120 may read out a corresponding luminance value and a digital number. Similarly, when the voltage value of the second sampling signal is the same as the voltage value of the second non-linear ramp signal at a certain point on the voltage versus time relation curve 220, then the ramp analog to digital converter 120 may read out a corresponding luminance value and a digital number.

In this embodiment, the voltage versus time relation curve 210 of the first non-linear ramp signal and the voltage versus time relation curve 220 of the second non-linear ramp signal are respectively curves or segmentation lines with an increasing slope. In this embodiment, each of the plurality of pixel units arranged in an array in the image sensor 110 may output a first image capturing signal and a second image capturing signal according to different exposure times in one image capturing operation. The first image capturing signal corresponds to a shorter exposure time, and the second image capturing signal corresponds to a longer exposure time. In other words, the image sensor 110 of this embodiment may obtain two frame data in one image capturing operation.

In this embodiment, the ramp analog to digital converter 120 may scan the first image capturing signal according to the voltage versus time relation curve 210 of the first non-linear ramp signal of FIG. 2A to obtain image details (digital number corresponding to a luminance) at a high brightness area (with a higher luminance) and use the same as the most significant bit data (for example, 4 bits). The ramp analog to digital converter 120 may scan the second image capturing signal according to the voltage versus time relation curve 220 of the second non-linear ramp signal of FIG. 2B to obtain image details at a low brightness area (with a lower luminance) and use the same as the least significant bit data (for example, 6 bits). Then, the memory 140 stores the plurality of most significant bit data and the plurality of least significant bit data together as a frame data.

It is noteworthy that, since the human eye has a lower ability to distinguish the details of the image at the high brightness area, the image detail at the high brightness area is stored at a lower amount of data (for example, 4 bits). Compared to frame data details at the high brightness area, the human eye has a higher ability to distinguish the details of the image at the low brightness area, the image detail at the low brightness area is stored at a higher amount of data (for example, 6 bits). In this embodiment, the digital numbers at the higher brightness area with higher luminance may be graded in a non-linear manner. Although the image has higher quantization noise, since the shot noise is much higher than the quantization noise, the quality of the image frame is not affected. For example, the horizontal axis (time) of the voltage versus time relation curve 210 of the first non-linear ramp signal may correspond to the digital number of grade 16 (for example, 4 bits). In this embodiment, the lower brightness area with lower luminance may also be graded in a non-linear manner. For example, the horizontal axis of the voltage versus time relation curve 220 of the second non-linear ramp signal may correspond to the digital number of grade 64 (for example, 6 bits). In other words, in the process of obtaining the frame with the image sensor, the electronic device 100 of this embodiment may, with the voltage versus time relation curve 210 of the first non-linear ramp signal and the voltage versus time relation curve 220 of the second non-linear ramp signal, obtain those equivalent to the plurality of most significant bit data and the plurality of least significant bit data having been compressed. Hence, it is not required to first store the frame data and then compress the same. Accordingly, the electronic device 100 of this embodiment effectively saves the data processing time and the storage size of the memory.

Figure 3:
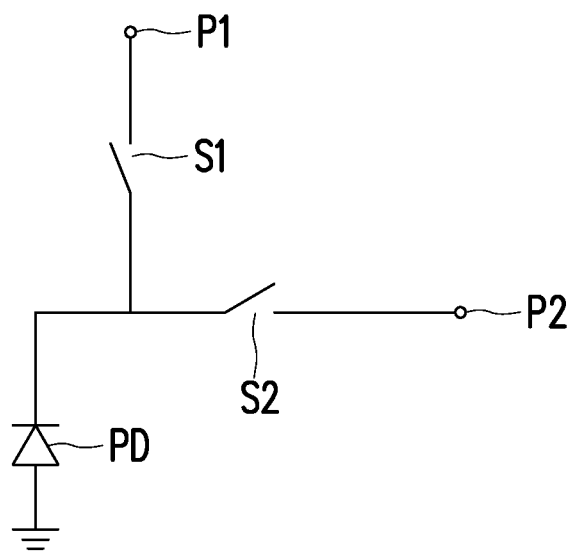
FIG. 3 is a schematic view of a pixel unit according to an embodiment of the disclosure.

FIG. 3 is a schematic view of a pixel unit according to an embodiment of the disclosure. Referring to FIG. 3, the equivalent circuit of the pixel units described in the above embodiment may be the same as shown in FIG. 3, but the disclosure is not limited thereto. In this embodiment, a pixel unit 300 may include a photodiode PD, a first switch S1 and a reset switch S2. One end of the photodiode PD is coupled to the first switch S1 and the reset switch S2. One end of the first switch S1 is coupled to a first end point P1, wherein the first end point P1 may be coupled to the ADC, and an ADC output end may be coupled to said memory. One end of the reset switch S2 is coupled to a second end point P2, and the second end point P2 may be coupled to a discharge path. Specifically, in one frame time, the photodiode PD correspondingly generates a photosensitive charge according to the result of light sensing, and a pixel unit 400 first receives a reset signal through the reset switch to perform discharging. Then, the pixel unit 400 receives the read-out signal through the first switch S1 to output the photosensitive charges accumulated by the photodiode PD to the ADC, and the ADC outputs the data to the memory for storage. In addition, said reset signal and said read-out signal may be, for example, pulse signals.

Figure 4:
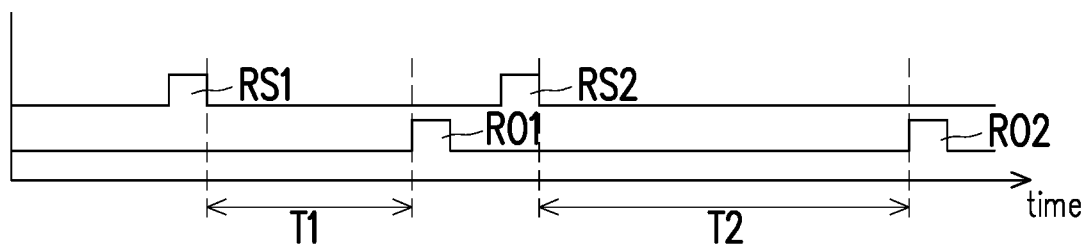
FIG. 4 is a timing diagram of operating a pixel unit according to an embodiment of the disclosure.

FIG. 4 is a timing diagram of operating a pixel unit according to an embodiment of the disclosure. Referring to FIG. 3 and FIG. 4, the reset switch S2 of the pixel unit 300 described in the above embodiment may receive a first reset signal RS1 and a second reset signal RS2 according to the timing diagram of FIG. 4, and the first switch S1 of the pixel unit 300 may receive a first read-out signal RO1 and a second read-out signal RO2 according to the timing diagram of FIG. 4. Specifically, in this embodiment, in one sampling operation, first, the reset switch S2 of the pixel unit 300 receives the first reset signal RS1, and then the first switch S1 receives the first read-out signal RO1, wherein a first time difference T1 between the first reset signal RS1 and the first read-out signal RO1 is a first exposure time. Next, the reset switch S2 of the pixel unit 300 receives the second reset signal RS2, and then the first switch S1 receives the second read-out signal RO2, wherein a second time difference T2 between the second reset signal RS2 and the second read-out signal RO2 is a second exposure time. In this embodiment, the first exposure time is shorter than the second exposure time. That is to say, the pixel unit 300 may perform two read-out actions in one sampling operation according to different exposure times to obtain the first image capturing signal and the second image capturing signal described in the above embodiments.

Figure 5:
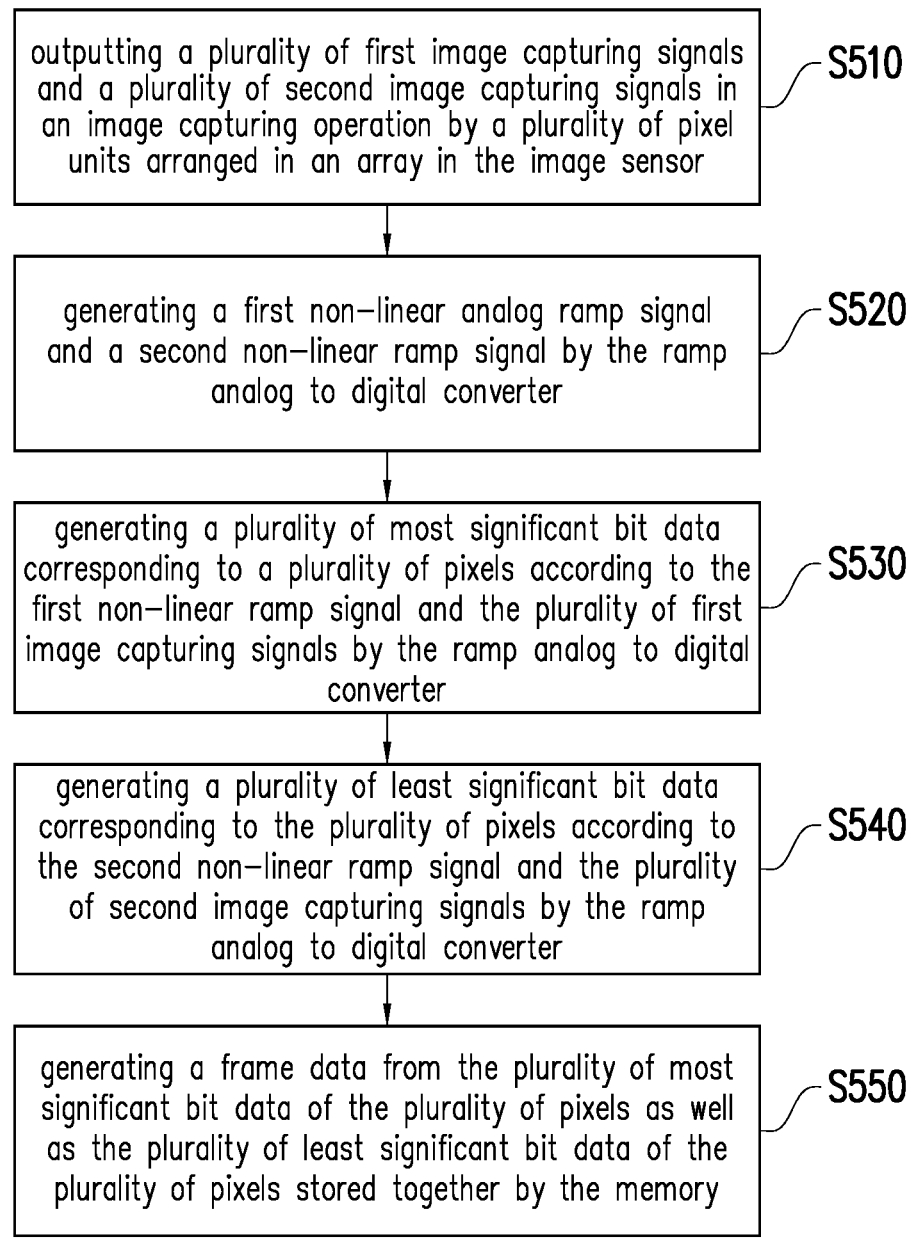
FIG. 5 is a flow chart of an image capture method according to an embodiment of the disclosure.

FIG. 5 is a flow chart of an image capture method according to an embodiment of the disclosure. Referring to FIG. 1 and FIG. 5, the image capture method of this embodiment is at least applicable to the electronic device 100 of the embodiment of FIG. 1. The electronic device 100 includes an image sensor 110, a ramp analog to digital converter 120 and a memory 140. In other words, the electronic device 100 may perform the following steps S510 to S550 to implement the image capture method of this embodiment. In step S510, the plurality of pixel units arranged in an array and set in the image sensor 110 output a plurality of first image capturing signals and a plurality of second image capturing signals in one image capturing operation. In step S520, the ramp analog to digital converter 120 generates a first non-linear analog ramp signal and a second non-linear ramp signal. In step S530, the ramp analog to digital converter 120 generates a plurality of most significant bit data corresponding to a plurality of pixels according to the first non-linear ramp signal and the plurality of first image capturing signals. In step S540, the ramp analog to digital converter 120 generates a plurality of least significant bit data corresponding to the plurality of pixels according to the second non-linear ramp signal and the plurality of second image capturing signals. In step S550, the memory 140 stores the plurality of most significant bit data of the plurality of pixels as well as the plurality of least significant bit data of the plurality of pixels together to generate a frame data.

Furthermore, other characteristics of components or details of implementation of the electronic device 100 of this embodiment can be understood sufficiently from the teaching, suggestion, and illustration of the embodiments of FIG. 1 to FIG. 4 and thus are not repeated hereinafter.

In sum of the above, in the electronic device and the image capture method of the disclosure two data read-out actions may be performed according to different exposure times by each one of the plurality of pixel units of the image sensor in one sampling operation to obtain a plurality of first image capturing signals and a plurality of second image capturing signals. The plurality of first image capturing signals may be scanned by the ramp analog to digital converter 120 according to the first non-linear analog ramp signal, and the plurality of second image capturing signals may be scanned according to the second non-linear analog ramp signal, so as to obtain the most significant bit data and the least significant bit data corresponding to each one of the pixels in a frame. Therefore, the electronic device and the image capture method of the disclosure may obtain the frame data of high quality (high dynamic range) in a short time and effectively save the memory size.

It will be apparent to those skilled in the art that various modifications and variations can be made to the disclosed embodiments without departing from the scope or spirit of the disclosure. In view of the foregoing, it is intended that the disclosure covers modifications and variations of this disclosure provided that they fall within the scope of the following claims and their equivalents.

What is claimed is:
1. An electronic device, comprising:
an image sensor, comprising a plurality of pixel units arranged in an array, the plurality of pixel units are configured to output a plurality of first image capturing signals and a plurality of second image capturing signals in an image capturing operation;

a ramp analog to digital converter, coupled to the image sensor and configured to generate a first non-linear analog ramp signal and a second non-linear ramp signal, wherein the ramp analog to digital converter generates a plurality of most significant bit (MSB) data corresponding to a plurality of pixels according to both the first non-linear ramp signal and the plurality of first image capturing signals, and the ramp analog to digital converter generates a plurality of least significant bit (LSB) data corresponding to the plurality of pixels according to both the second non-linear ramp signal and the plurality of second image capturing signals; and a memory, coupled to the ramp analog to digital converter and configured to store the plurality of MSB data of the plurality of pixels as well as the plurality of LSB data of the plurality of pixels together for generating a frame data, wherein the frame data serve to demonstrate an image with high brightness information and low brightness information, the plurality MSB data included in the frame data only serve to store the high brightness information, and the plurality LSB data included in the frame data only serve to store the low brightness information, wherein the plurality of MSB data included in the frame data have fewer bits than the plurality of LSB data included in the frame data.

2. The electronic device according to claim 1, wherein, in the image capturing operation, the plurality of pixel units output the plurality of first image capturing signals according to a first exposure time and output the plurality of second image capturing signals according to a second exposure time, wherein the first exposure time is different from the second exposure time.

3. The electronic device according to claim 2, wherein each of the plurality of pixel units comprises:
a photodiode;
a first switch, coupled to the photodiode; and
a reset switch, coupled to the photodiode, wherein the reset switch is configured to receive a first reset signal and a second reset signal in the image capturing operation, and the first switch is configured to receive a first read-out signal and a second read-out signal in the image capturing operation,
wherein a first time difference between the first reset signal and the first read-out signal is the first exposure time, and a second time difference between the second reset signal and the second read-out signal is the second exposure time.

4. The electronic device according to claim 2, wherein the first exposure time does not equal the second exposure time.

5. The electronic device according to claim 1, wherein the memory is further configured to store only the frame data in the image capturing operation.

6. The electronic device according to claim 1, wherein the plurality of most significant bit data are 4-bit data, and the plurality of least significant bit data are 6-bit data.

7. The electronic device according to claim 1, wherein a voltage versus time relation curve of the first non-linear ramp signal and a voltage versus time relation curve of the second non-linear ramp signal are respectively a curve with an increasing slope or a segmental line.

8. The electronic device according to claim 1, wherein the image sensor is a fingerprint sensor.

9. An image capture method, comprising:
outputting a plurality of first image capturing signals and a plurality of second image capturing signals in an image capturing operation by a plurality of pixel units arranged in an array in an image sensor;
generating a first non-linear analog ramp signal and a second non-linear ramp signal by a ramp analog to digital converter;
generating a plurality of most significant bit (MSB) data corresponding to a plurality of pixels according to both the first non-linear ramp signal and the plurality of first image capturing signals by the ramp analog to digital converter;
generating a plurality of least significant bit (LSB) data corresponding to the plurality of pixels according to both the second non-linear ramp signal and the plurality of second image capturing signals by the ramp analog to digital converter; and
storing the plurality of MSB data of the plurality of pixels as well as the plurality of LSB data of the plurality of pixels together by a memory for generating a frame data,
wherein the frame data serve to demonstrate an image with high brightness information and low brightness information, the plurality MSB data included in the frame data only serve to store the high brightness information, and the plurality LSB data included in the frame data only serve to store the low brightness information,
wherein the plurality of MSB data included in the frame data have fewer bits than the plurality of LSB data included in the frame data.

10. The image capture method according to claim 9, wherein the step of outputting the plurality of first image capturing signals and the plurality of second image capturing signals in the image capturing operation by the plurality of pixel units arranged in the array in the image sensor comprises:
outputting the plurality of first image capturing signals by the plurality of pixel units according to a first exposure time in the image capturing operation; and
outputting the plurality of second image capturing signals by the plurality of pixel units according to a second exposure time in the image capturing operation, wherein the first exposure time is different from the second exposure time.

11. The image capturing method according to claim 10, wherein each of the plurality of pixel units comprises a photodiode, a first switch and a reset switch, and the step of outputting the plurality of first image capturing signals and the plurality of second image capturing signals in the image capturing operation by the plurality of pixel units arranged in the array in the image sensor comprises: operating the plurality of pixel units to perform:
receiving a first reset signal and a second reset signal by the reset switch in the image capturing operation; and
receiving a first read-out signal and a second read-out signal by the first switch in the image capturing operation,
wherein a first time difference between the first reset signal and the first read-out signal is the first exposure time, and a second time difference between the second reset signal and the second read-out signal is the second exposure time.

12. The image capture method according to claim 10, wherein the first exposure time does not equal the second exposure time.

13. The image capture method according to claim 9, wherein the memory stores only the frame data in the image capturing operation.

14. The image capture method according to claim 9, wherein the plurality of most significant bit data are 4-bit data, and the plurality of least significant bit data are 6-bit data.

15. The image capture method according to claim 9, wherein a voltage versus time relation curve of the first non-linear ramp signal and a voltage versus time relation curve of the second non-linear ramp signal are respectively a curve with an increasing slope or a segmental line.

16. The image capture method according to claim 9, wherein the image sensor is a fingerprint sensor.

* * * * *